US008887021B2

(12) United States Patent
Coe

(10) Patent No.: US 8,887,021 B2
(45) Date of Patent: Nov. 11, 2014

(54) CONTINUOUSLY INTERLEAVED ERROR CORRECTION

(75) Inventor: Tim Coe, Camarillo, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 13/618,380

(22) Filed: Sep. 14, 2012

(65) Prior Publication Data

US 2013/0013972 A1 Jan. 10, 2013

Related U.S. Application Data

(63) Continuation of application No. 12/270,774, filed on Nov. 13, 2008, now Pat. No. 8,276,047.

(51) Int. Cl.
| | |
|---|---|
| *H03M 13/00* | (2006.01) |
| *G06F 9/44* | (2006.01) |
| *H03M 13/27* | (2006.01) |
| *H03M 13/29* | (2006.01) |
| *H03M 13/15* | (2006.01) |

(52) U.S. Cl.
CPC ...... *H03M 13/2757* (2013.01); *H03M 13/2732* (2013.01); *H03M 13/152* (2013.01); *H03M 13/29* (2013.01); *H03M 13/2721* (2013.01); *H03M 13/6561* (2013.01); *H03M 13/15* (2013.01)
USPC .......................... 714/752; 714/755; 714/782

(58) Field of Classification Search
CPC .......................... H04L 1/0057; H03M 13/116
USPC ............... 714/752, 755, 780, 782, 784, 801
See application file for complete search history.

(56) References Cited

U.S. PATENT DOCUMENTS

| | | | |
|---|---|---|---|
| 6,023,783 A | 2/2000 | Divsalar et al. | |
| 6,665,832 B1 | 12/2003 | Neufeld et al. | |
| 6,948,109 B2 | 9/2005 | Coe | |
| 7,146,553 B2 * | 12/2006 | Jarchi et al. | 714/755 |
| 7,289,530 B1 | 10/2007 | Yuan et al. | |
| 8,352,840 B2 * | 1/2013 | Crozier et al. | 714/780 |
| 8,429,483 B1 * | 4/2013 | Varnica et al. | 714/752 |
| 2007/0143659 A1 | 6/2007 | Ball | |
| 2007/0288833 A1 | 12/2007 | Djurdjevic et al. | |

OTHER PUBLICATIONS

M. Bogino et al., "Sliding window digital fountain codes for streaming of multimedia application," IEEE Int. Symp. Circuits and System (ISCAS) pp. 3467-3470, May 2007.
D. Sejdinovic et al. "Expanding Fountain Codes for Unequal Error Protection," 41st Asilomar Conf. on Signals, Systems and Computers, Nov. 4-7, 2007.

(Continued)

*Primary Examiner* — Fritz Alphonse
(74) *Attorney, Agent, or Firm* — Klein, O'Neill & Singh, LLP

(57) ABSTRACT

Continuously interleaved codewords are used in a communication system to provide error correction capability. In general, each codeword shares symbols with both preceding and subsequent codewords, when the codewords are arranged in an order, such that correction of symbols in any one codeword also corrects symbols in another codeword and correction of symbols in any codeword may allow, considering possible corrections of intermediate codewords, for further correction of any codeword in the order of codewords. In one embodiment received information may be arranged in subframes, with each subframe including terminal symbols of a plurality of codewords, each of the plurality of codewords including symbols in multiple subframes.

11 Claims, 10 Drawing Sheets

(56) References Cited

OTHER PUBLICATIONS

International Search Report on corresponding PCT application (PCT/US2009/064416) from International Searching Authority KR) dated Jul. 13, 2010.
Written Opinion on corresponding PCT application (PCT/US2009/064416) from International Searching Authority (KR) dated Jul. 13, 2010.
Felstrom et al., "Time-Varying Periodic Convolutional Codes with Low-Density Parity-Check Matrix," IEEE Transactions on Information Theory, vo. 45, No. 6, Sep. 1999 (pp. 2181-2191).
M. Luby, "LT Codes", The 43rd Annual IEEE Symposium on Foundations of Computer Science, 2002.
Extended Search Report from EPO on co-pending EP application (EP 09826845.1) dated Jul. 30, 2012.
Clark G. C. et al., "Error Correction Coding for Digital Communications, System Applications", Jan. 1, 1981, Error Correction Coding for Digital Communications, New York, Plenum Press, US, pp. 331-341, XP002266184.
U.S. Appl. No. 12/270/774, filed Nov. 13, 2008, Tim Coe, 2010-0122149, Office Action Nov. 22, 2011, Notice of Allowance Aug. 24, 2012.
Office Action on related Chinese Application No. 200980145537.4 dated Apr. 15, 2013.
Response to Office Action on related Chinese Application No. 200980145537.4 dated Aug. 21, 2013.
Notice of Allowance on related Chinese Application No. 200980145537.4 dated Dec. 27, 2013.
Contribution WD11-38, 011/15 Interim Meeting, Cortina Systems, Inc.
Contribution WD11-39, 011/15 Interim Meeting, Cortina Systems, Inc.
K. Zigangirov et al., Encoders and Decoders for Braided Block Codes, ISIT 2006, Seattle, USA, Jul. 9-14, 2006.

\* cited by examiner

Transmit stream for sub frame 7

| 32640 | | 95 | 31 | 0 |
|---|---|---|---|---|
| | | A | B | |

Codewords

| | | 1023 | 959 | 576 | 512 | 511 | 510 | | 1 | 0 |
|---|---|---|---|---|---|---|---|---|---|---|
| <5,31, Bitnum [9:0]> | 5 | 0 | 0 | B | | 0 | 0 | | | |
| <6,31, Bitnum [9:0]> | 6 | 0 | 0 | | A | 0 | 0 | | | |
| <7,31, Bitnum [9:0]> | 7 | 0 | 0 | | | 0 | 0 | | B | A |

FIG. 10

CONTINUOUSLY INTERLEAVED ERROR CORRECTION

CROSS-REFERENCE TO RELATED APPLICATION

This application is a continuation of application Ser. No. 12/270,774 filed Nov. 13, 2008, now U.S. Pat. No. 8,276,047, which is incorporated herein by reference.

BACKGROUND

The present invention relates generally to forward error correction, and more particularly to forward error correction using a continuously interleaved code.

Communication systems often provide large amounts of information over communication channels. The communication channels may, for example, make use of fiber optic links, wires, radio waves, storage mediums. Communication channels, however, generally insert noise into signals communicated over the communication channels, that is a signal received by a receiver over a communication channel may not be the same as the signal as transmitted by a transmitter. In addition, both the transmitter and the receiver may also insert noise into signals being transmitted or received. Accordingly, redundant information is often included in transmitted data, with the redundant information allowing a receiver to determine information intended to have been transmitted.

A number of coding schemes are known for determining the redundant information to be included with transmitted data. Prior to transmission the coding schemes generally convert information symbols or blocks of information symbols into code symbols or blocks of code symbols, and after reception the code symbols or blocks of code symbols are used to recover the information symbols or blocks of information symbols. Selection of a particular coding scheme, and a particular code used in a particular coding scheme, may depend on a variety of factors, including a desired bit error rate (BER), overhead associated with a particular coding scheme and code, ease of encoding and decoding, and other factors.

BRIEF SUMMARY OF THE INVENTION

The invention provides for use of a continuously interleaved code. In one aspect the invention provides a method of encoding data for transmission over a communication medium, comprising: iteratively forming codewords, each codeword having n symbols and each codeword formed using k symbols, with each codeword formed using at least some symbols of previously formed codewords.

In another aspect the invention provides a method of forming codewords with error correction information, comprising: forming a codeword of n bits using k bits, the codeword including n-k parity bits, each of the n bits being in at least one other codeword of n bits, at least some of the k bits being parity bits of other codewords.

In another aspect the invention provides a method of decoding received information to correct for errors in communication of the received information, comprising: receiving a stream of information, the information comprised of bits; iteratively decoding codewords of the received stream of information, each bit of each codeword being in at least two codewords, with some of the bits of any particular codeword of the codewords being in a codeword whose last bit was received prior to receipt of the particular codeword, and with others of the bits of any particular codeword received subsequent to receipt of the last bit of the particular codeword.

In another aspect the invention provides a method of decoding information arranged in subframes, each subframe including 32640 bits, each subframe including a final 510 bits of 64 codewords of a BCH (1020,988) code, with a first 510 bits of the 64 codewords spread over 8 other subframes, each of which also a final 510 bits of 64 other codewords of a BCH (1020,988) code, comprising decoding codewords which terminate in a particular subframe, correcting bits of the codewords pursuant to the decoding, including bits which are in other subframes and other codewords, and decoding the other codewords.

These and other aspects of the invention are more fully comprehended upon review of this disclosure.

BRIEF DESCRIPTION OF THE DRAWINGS

FIG. 10 is a diagram showing bit mappings of selected bits of a subframe to codewords in accordance with aspects of the invention.

DETAILED DESCRIPTION

Figure 1:
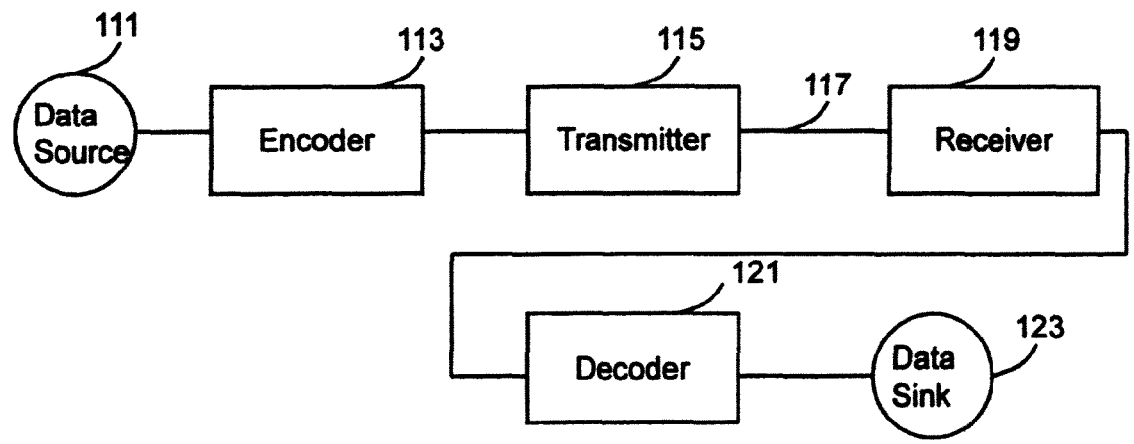
FIG. 1 is a block diagram of a communication system in accordance with aspects of the invention.

FIG. 1 is a block diagram of a communication system in accordance with aspects of the invention. On a transmission side, a data source 111 provides data intended for transmission. The data is received by an encoder 113. The encoder encodes the data to form codewords. Information of the codewords is transmitted by a transmitter 115 over a communications medium 117. In some embodiments the encoder and the transmitter are both provided by circuitry, for example in a single semiconductor device or chip or in multiple semiconductor devices or chips. In some embodiments the encoder and/or the transmitter may be provided by a programmable processor, with the processor programmed by instructions to provide encoding and/or transmission functions. In many embodiments the communication medium is a fiber optic line. In various embodiments, however, the communication medium may be a wire, a storage medium, or an airwave communication channel.

On a receiver side, a receiver 119 receives information from the communication medium. The received information will generally be the transmitted information, potentially altered by noise of the communication medium. A decoder decodes codewords of the received information to recover the data intended for transmission, and provides the recovered data to a data sink 123. As on the transmission side, the receiver and the decoder may each be a separate semiconductor device or combined in a single semiconductor device, or may be implemented as part of a programmable processor programmed by instructions.

In most embodiments the transmitter side and the receiver side as illustrated in FIG. 1 will each be a node in a network and have at least one transmitter and at least one receiver to provide for bidirectional communication between the two nodes, and will have further transmitters and receivers for communicating with further nodes.

The data intended for transmission is encoded by the encoder to form continuously interleaved codewords. In general, the continuously interleaved codewords share symbols with previously formed codewords and subsequently formed codewords. For example, the continuously interleaved codewords may each be formed by encoding at least some symbols of previously determined codewords and additional symbols, preferably with each symbol in each codeword being part of at least two codewords. Also for example, in some embodiments a continuously interleaved n bit codeword may be formed of k bits, with at least some of the k bits being data bits of other codewords and at least some of the k bits being parity bits of other codewords.

In most embodiments, in a stream of codewords, an initial first number of codewords may include padded symbols, for example zero symbols, for some of the symbols used in encoding, until a sufficient number of codewords have been formed to provide symbols for use in forming subsequent codewords. For example, in some embodiments a codeword may include k symbols, of which k/2 symbols used in forming the codeword are symbols shared with previously formed codewords. In such an embodiment, in a stream codewords, for example including a number of codewords several orders of magnitude greater than k, after an initial k/2−1 codewords, codewords share k/2 symbols with previously formed codewords. In most embodiments, upon commencement of operation of the communication system a first number of codewords may only share symbols with subsequent codewords, and a second number of codewords, which may be the same number as the first number of codewords, may only share symbols with prior codewords. In many embodiments, however, the number of codewords successively communicated by the communication system is many times greater than the first number or the second number, and in many embodiments the number of codewords successively communicated by the communication system is several orders of magnitude, for example 3 or more, or 10 or more, or 100 or more, greater than the first number or the second number. As an example, two nodes in a long haul telecommunications network, particularly two nodes coupled by a submarine cable, often continuously communicate successive codewords for hours or days or longer, and often at gigahertz bit rates. Accordingly, impact on coding and decoding of codewords approximate a beginning and approximate an end of communication of a stream of codewords is generally small and may be discounted.

Figure 2:
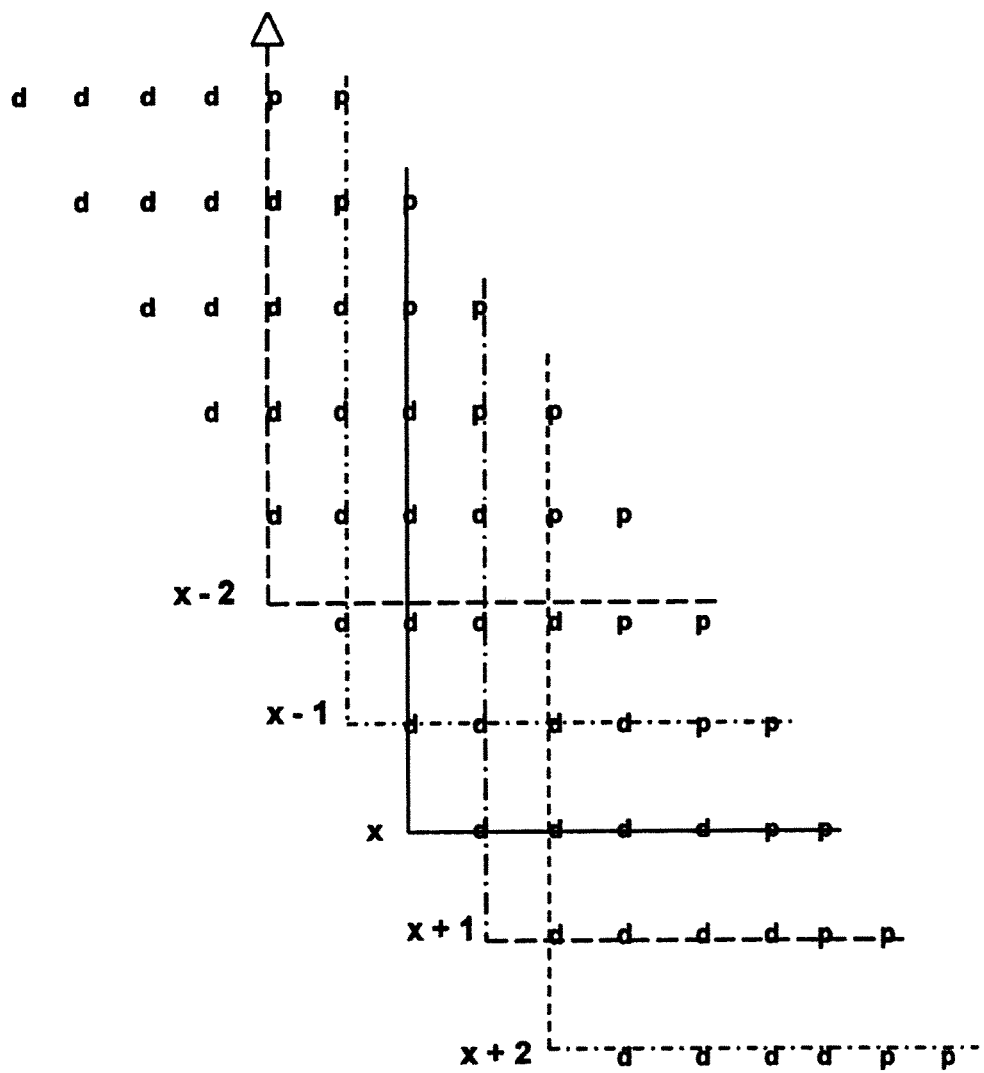
FIG. 2 is a diagram showing codewords in a transmission stream in accordance with aspects of the invention.

FIG. 2 is a diagram providing an example of continuously interleaved codewords in accordance with aspects of the invention. In FIG. 2 a stream of data bits d are provided for encoding, with an encoder determining parity bits p for a codeword of 12 bits. The stream of bits is within a longer stream of bits, with the stream of bits forming some contiguous portion of the longer stream of bits. As illustrated in FIG. 2, the bits are arranged in rows and columns, with each descending row offset to the right by one column. Moreover, as illustrated in FIG. 2 each row has the same number of bits and, for the particular example of FIG. 2, each column also has the same number of bits (for the columns with bits completely shown in FIG. 2), with both the rows and columns having the same number of bits.

A particular codeword x includes, in this example of FIG. 2, 2 parity bits, with the encoder determining the 2 parity bits by encoding 2 parity bits from previously determined codewords, 4 data bits which are also part of previously determined codewords, and 4 additional data bits. As shown in FIG. 2, the 2 parity bits from previously determined codewords and the 4 data bits which are also part of previously determined codewords are found in a column adjacent and to the left of a first column of a row including the 4 additional data bits and, after encoding, the 2 parity bits. Thus, in many embodiments the previously determined codewords are transmitted or are ready for transmission or are in the process of transmission prior to encoding or completing encoding of the particular codeword. Thus, the row including the 4 additional bits and the 2 parity bits may be considered to be a terminating row for the particular codeword x. In most embodiments, as a codeword is determined, the bits of the terminating row are provided to a transmitter for transmission, as well as temporarily stored for determination of further codewords.

A subsequent codeword x+1, which terminates in a row immediately following the row terminating codeword x, also includes 2 parity bits, with the encoder determining the 2 parity bits by encoding 2 parity bits from other previously determined codewords, 4 data bits which are also part of previously determined codewords (with one of the data bits being one of the 4 additional data bits of codeword x), and 4 further additional data bits. Similarly, for a codeword x+2, which terminates in a row immediately following the row terminating codeword x+1, whose parity bits have not yet been determined, the encoder determines the parity bits by encoding 2 parity bits from yet further previously determined codewords, 4 data bits which are also part of previously determined codewords (with one of the data bits being one of the 4 additional data bits of codeword x and with one of the data bits being one of the 4 additional data bits of codeword x+1), and 4 additional data bits.

During decoding, for example after reception by a receiver, codeword x may be decoded. It is possible, however, that codeword x may have a greater number of errors than may be corrected by the particular coding scheme used. In such an instance it is possible that codeword x+1 may be successfully decoded and errors in codeword x+1 corrected. Among the corrected errors in codeword x+1 may be the bit shared by codeword x and codeword x 1 and which may therefore allow for correction of codeword x by reducing the number of errors in codeword x to a number correctable by the particular coding scheme. Moreover, correction of codeword x+1, even if the correction does not correct the shared bit of codeword x and codeword x+1, may result in correction of bits of other codewords, which may have been uncorrectable, and which also may share bits with codeword x. The same statements apply to codeword x+2, which also shares a bit with codeword x. In addition, correction of codewords which do not share bits with codeword x may allow for correction of codewords which share bits with codeword x, or allows for correction of codewords which share bits with codewords which share bits with codeword x, and so on.

Figure 3:
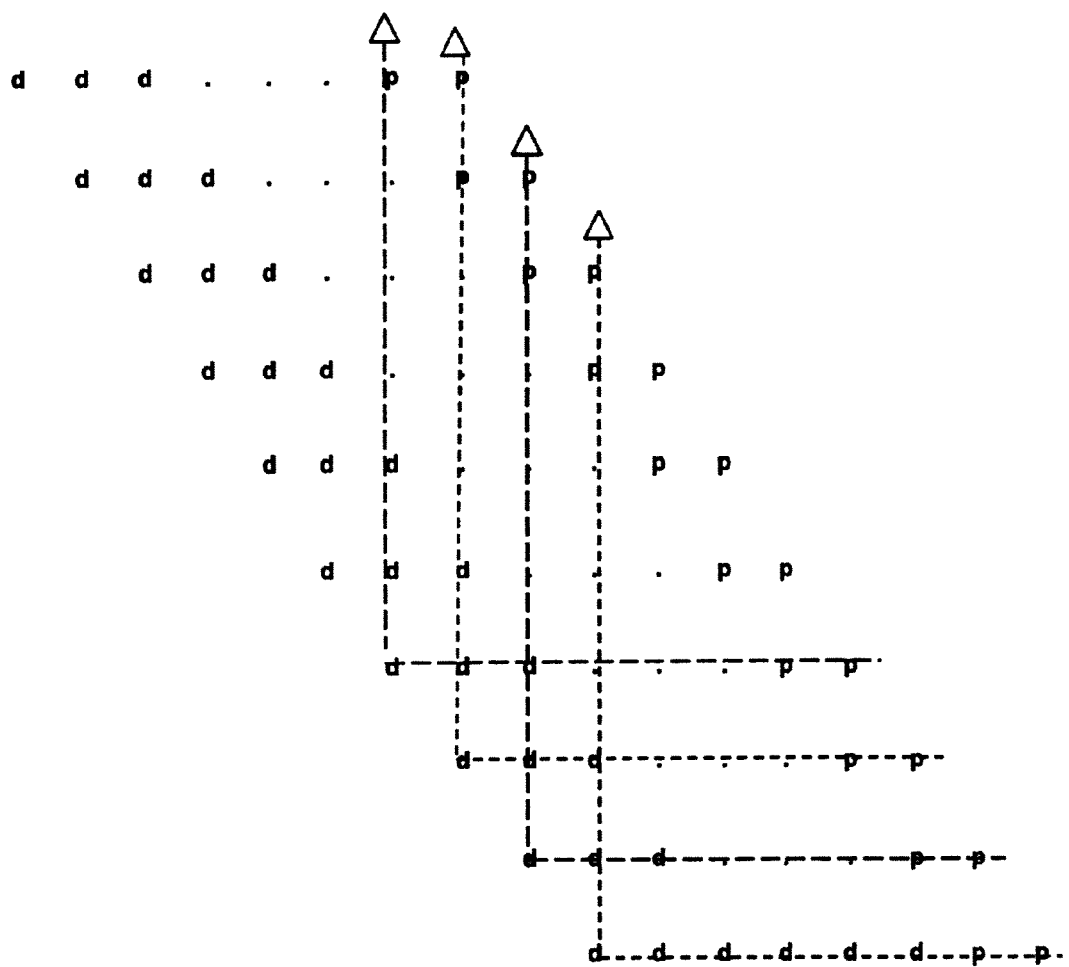
FIG. 3 is a further diagram showing codewords in a transmission stream in accordance with aspects of the invention.

FIG. 3 is a diagram providing a further example of interleaved codewords in accordance with aspects of the invention. The interleaved codewords of FIG. 3 are arranged similarly to the interleaved codewords of FIG. 2. The interleaved codewords of FIG. 3, however, include an unspecified number of data bits and parity bits. Thus, the interleaved codewords of FIG. 3 may, for example, include 988 bits used to form 32 parity bits (as in for example a BCH (1020,988)

code), with some of the 988 bits being data bits and some of the 988 bits being parity pits determined by forming other codewords. Alternatively, the interleaved codewords of FIG. 3 may instead include some other number of bits used to form codewords for some other code.

Figure 4:
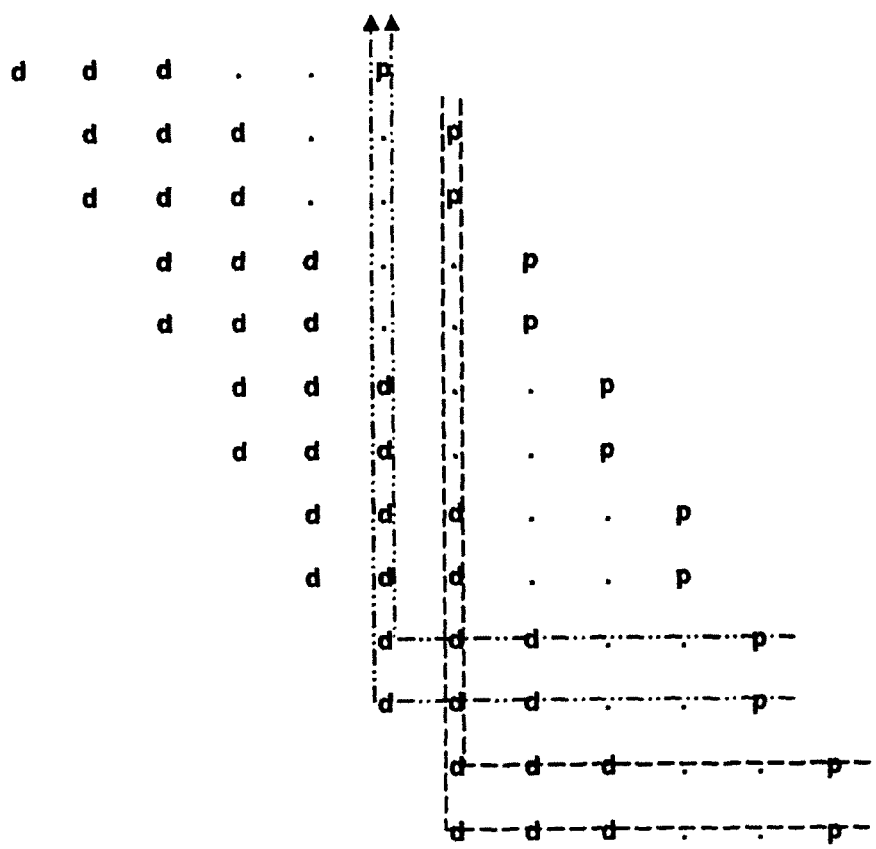
FIG. 4 is a yet a further diagram showing codewords in a transmission stream in accordance with aspects of the invention.

FIG. 4 is a diagram providing yet a further example of interleaved codewords in accordance with aspects of the invention. The interleaved codewords of FIG. 4 are arranged in a manner somewhat similar to the codewords of FIGS. 2 and 3, but in the diagram of FIG. 4 every other descending row is offset to the right by one column. As illustrated in the example of FIG. 4, each column of bits is included in two codewords, with the result that most bits are in 3 different codewords. In various embodiments, by rearranging the format of rows and columns or rearranging which bits in the various row and columns are used in a particular codeword, different coverage of bits by codewords may be obtained.

Figure 5:
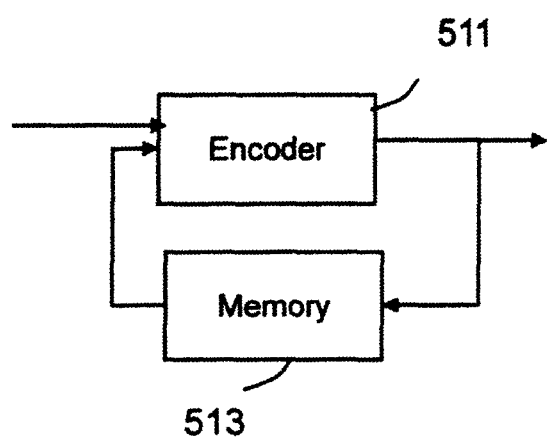
FIG. 5 is a block diagram including an encoder in accordance with aspects of the invention.

FIG. 5 is a block diagram including an encoder in accordance with aspects of the invention. As illustrated in FIG. 5, an encoder 511 receives information and forms the information into codewords. The codewords are provided to further circuitry (not shown) which implements, for example transmission functions. The encoder may be implemented, for example, as a programmable processor or as discrete circuitry, for example using a linear feedback shift register implementing encoding for a particular code. In some embodiments the encoder performs encoding for a BCH code, for example a BCH (1020,988) code, and in some embodiments encoding is performed using a generator polynomial of $(x^{10}+x^3+1)$ $(x^{10}+x^3+x^2+x+1)$ $(x^{10}+x^5+x^3+x^2+1)$ $(x^2+1)$.

The codewords are also provided to a memory 513. In some embodiments the memory may be implemented within the encoder 511, but is shown as a separate memory block in FIG. 5. As codewords are generated by the encoder, the codewords are stored in memory. The encoder subsequently forms further codewords using some of the symbols, generally bits, of previously formed codewords, for example as discussed with respect to FIGS. 2-4.

Figure 6:
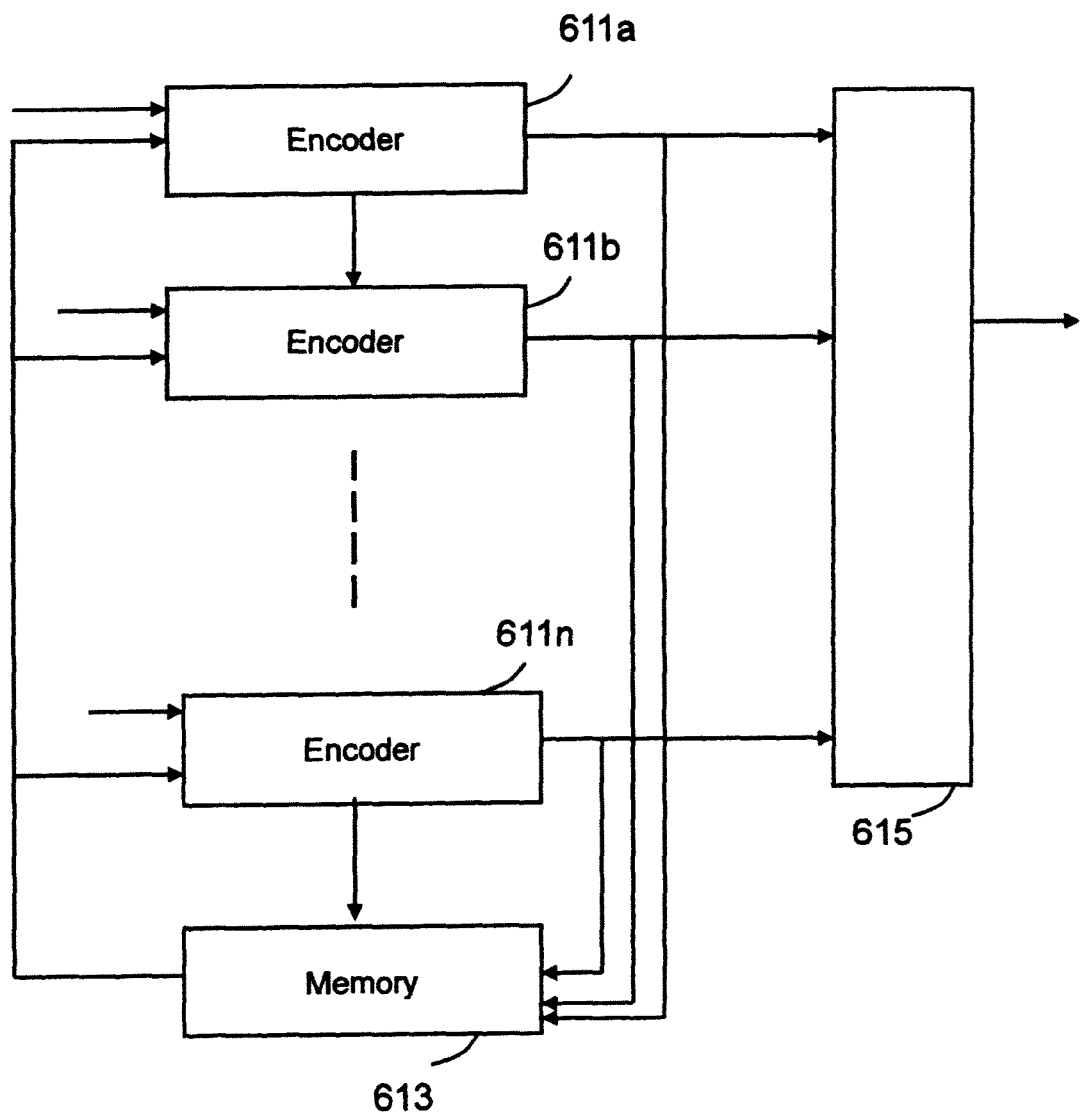
FIG. 6 is a further block diagram including a plurality of encoders in accordance with aspects of the invention.

FIG. 6 is a block diagram including a plurality of encoders 611a-n in accordance with aspects of the invention. In many embodiments a plurality of codewords may be fowled in parallel, with a multiplexer 615 or other circuitry combining the parallel codewords or portions of codewords into a single stream, in some embodiments in an interleaved manner. For example, in some embodiments a predefined number of bits may be generated each clock cycle, for example 1 bit or some other number of bits may be generated each clock cycle. The predefined number of bits may be provided to a memory 613, with the bits thereafter used to form further codewords. For example, bits from a first encoder 611a may be provided to the memory, and then fed into encoder 611b, or more generally 611b-n in a round robin manner, along with further bits intended for transmission, to form further codewords or portions of codewords.

Figure 7:
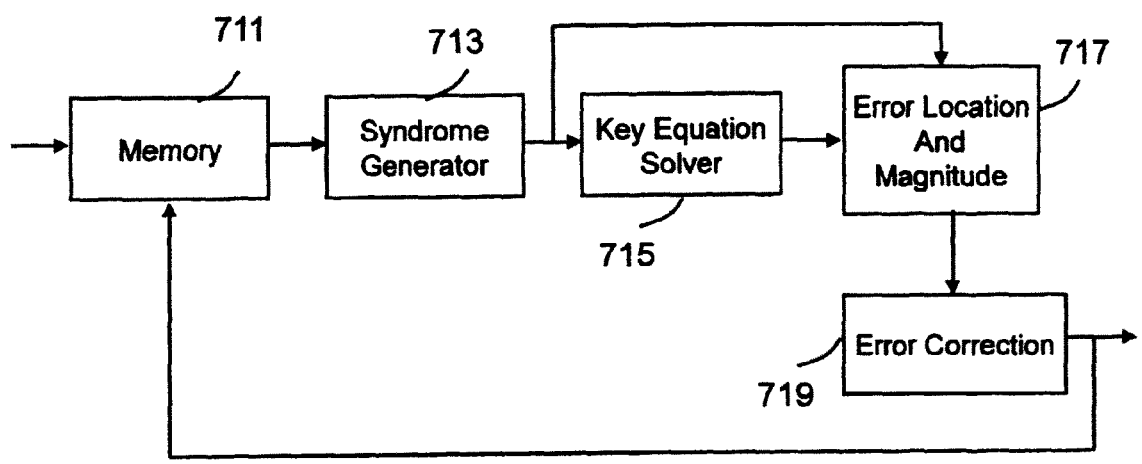
FIG. 7 is a block diagram including a decoder in accordance with aspects of the invention.

FIG. 7 is a block diagram including a decoder in accordance with aspects of the invention. The input data stream comprises received words, which are code words modified by error signals such as provided by noise. The received words are provided to memory 711 and the memory stores the received words.

The received words are provided to a decoder. As illustrated in FIG. 6, the decoder includes syndrome generator 713, a key equation solver 715, and an error location and magnitude block 717, and an error correction block 719. In various embodiments, different decoder circuitry and different decoding methods may be used, a variety are known in the art. The syndrome generator generates syndrome words that are provided to the key equation solver and the error location and magnitude block. The key equation solver generates an error polynomial which is also provided to the error location and magnitude unit. The error location and magnitude block generates an error vector, which is provided to the error correction block. The error correction block corrects provides corrected data. The corrected data is provided back to the memory for further rounds of decoding and, generally upon a fixed number of corrections, outputs corrected words. In some embodiments the corrected data may also be provided to the syndrome generator, or memory associated with the syndrome generator, for use in modifying syndromes.

Thus, the corrected data is provided to the memory, and overwrites or otherwise replaces previously stored uncorrected data. Thus, for example, codeword x may have contained y errors prior to correction. The corrected data for codeword x, however, contains fewer than y errors, and so the corrected data is written in place of the uncorrected data. As errors are corrected in codeword x, other previously uncorrectable codewords sharing bits with codeword x may now have a sufficient number of correct bits such that the previously uncorrectable codewords may be corrected. Further, upon correction of the previously uncorrectable codewords, still other previously uncorrectable codewords which share bits with the previously uncorrectable codewords may now be corrected. Accordingly, codewords may be iteratively decoded.

Figure 8:
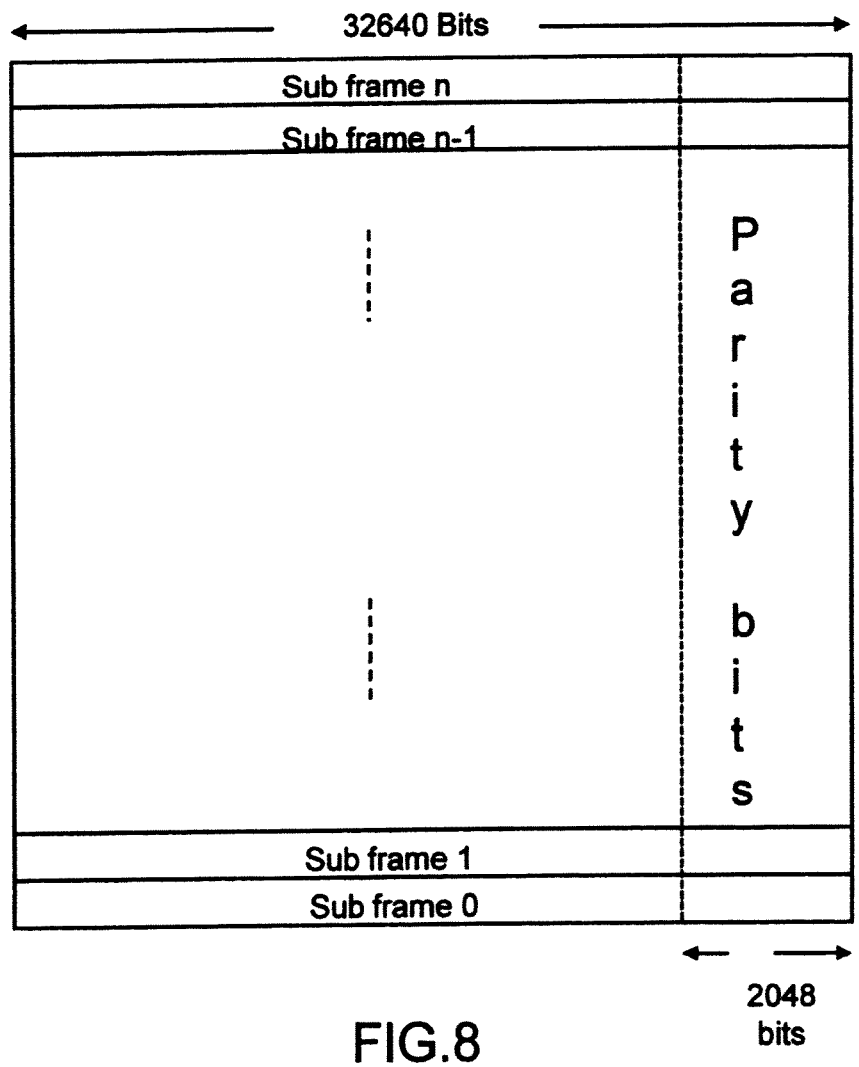
FIG. 8 is a diagram showing a plurality of subframes in accordance with aspects of the invention.

FIG. 8 shows an example of a series of subframes, numbered 0 to n, in a framed data communication system in accordance with the invention. The subframes may be, for example, subframes in compliance with ITU-T Recommendation G.975 or proposals for further revisions of ITU-T Recommendation G.975. For the purposes of FIG. 8, a subframe is identified by an integer, with a lower integer indicating a more recently transmitted or received subframe. Accordingly, as illustrated in FIG. 8, subframe 0 is the most recently transmitted or received subframe, subframe 1 is the next most recently transmitted or received subframe, and so on. Each subframe in the example of FIG. 8 includes 32640 bits, of which nominally 2048 are intended to be parity bits.

In one embodiment utilized for the example shown in FIG. 8, the communication system uses continuously interleaved BCH (1020,988) codewords. The BCH (1020,988) codeword includes 988 data bits and 32 parity bits, for a total of 1020 bits. The communication system organizes information into subframes of 32640 bits. Each subframe includes a final 510 bits of each of 64 codewords. The final 510 bits of the 64 codewords include 32 parity bits, for a total 2048 bits for 64 codewords, and the parity bits may therefore be conveniently placed in the 2048 bit locations for parity bits in the subframe. In this regard, bitwise interleaving of bits from the 64 codewords during a transmission process may ease processing of the communication system in arranging for the final 2048 bits of the subframe to include the parity bits of the 64 codewords.

8 previously received subframes contain the first 510 bits of each of the 64 codewords, with preferably each of the 8 previously received subframes containing 64 or 63 bits of each of the 64 codewords. The previously received subframes also include the final 510 bits of 64 other codewords, thus the first 510 bits of the 64 codewords in the 8 previously received subframes are also in the codewords terminating in these subframes. Moreover, as the final 510 bits of the 64 codewords are also part of codewords received in the next 8 subframes, the final 510 bits of each of the 64 codewords are also in codewords terminating in those subframes.

Figure 9:
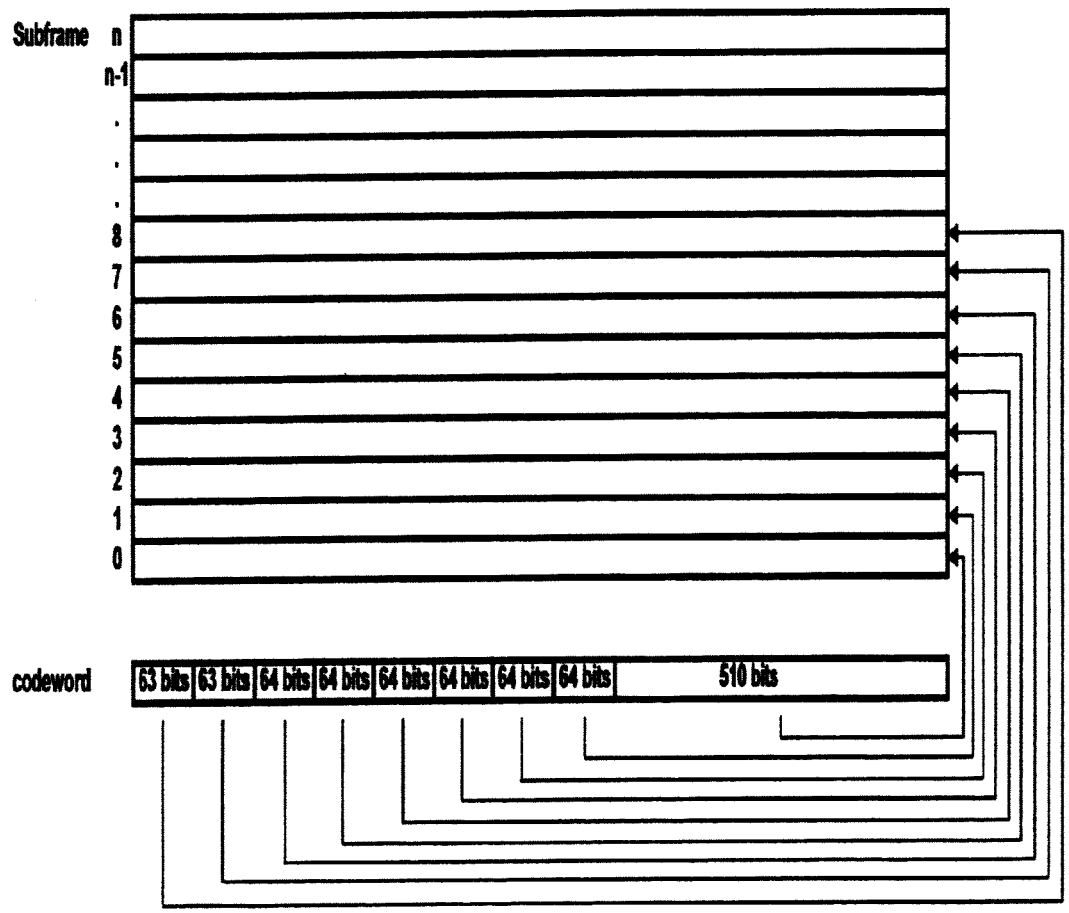
FIG. 9 is a diagram showing bit mappings of a codeword to subframes in accordance with aspects of the invention.

FIG. 9 is a diagram showing bit mappings of a codeword across subframes. In FIG. 9, a codeword includes 1020 bits. A final 510 bits of the codeword are in a subframe 0. A first set of 64 bits preceding the final 510 bits are in a subframe 1. A second set of 64 bits preceding the first set of 64 bits are in a subframe 2. A third set of 64 bits preceding the second set of 64 bits are in a subframe 3. A fourth set of 64 bits preceding the third set of 64 bits are in a subframe 4. A fifth set of 64 bits preceding the fourth set of 64 bits are in a subframe 5. A sixth set of 64 bits preceding the fifth set of 64 bits are in a subframe 6. A seventh set of 63 bits preceding the sixth set of 63 bits are in a subframe 7. An eighth set of 63 bits preceding the seventh set of 63 bits are in a subframe 8.

In most embodiments bits of various codewords are also interleaved with another. In one embodiment, each bit in a transmission may be assigned a unique identifier: <subframenum, bitloc[14:0]>, where subframenum is an integer which specifies a subframe and bitloc[14:0] specifies a bit position, within a 32640 bit subframe. Lower subframenum integers indicate more recently transmitted subframes and within a subframe, 0 is the last bit transmitted in time, 1 is the next to last bit transmitted in time and so on. Each BCH(1020, 988) codeword may be assigned a unique identifier: <subframenum, codenum[5:0]>, where subframenum is an integer which specifies the subframe that contains the last 510 bits of the codeword including the codeword's parity and codenum [5:0] specifies the codeword. Each bit within each BCH (1020,988) codeword may be assigned a unique identifier: <subframenum, codenum[5:0], bitnum[9:0]>, where bitnum [9:0] specifies the bit with the BCH(1020,988) codeword, where bit 0 is the last bit received in time, bit 1 is the next to last bit received in time, and so on.

The location of codeword bits in a transmission stream may be determined as follows. For bitnum[9:0] between 0 and 509, the location of the codeword bits are in transmission stream <subframenum, {bitnum[8:0], codenum[5:0]}>, with {a, b} indicates a concatenation of a and b. For bitnum[9:0] between 512 and 1022, excluding 959, the location of the codeword bits are in transmission stream <subframenum+ bitnum[8:6]+1, {bitnum[5:0], bitnum[8:6], codenum[5:0] ^ bitnum[5:0]}>, with ^ indicating a bitwise XOR operation. Codeword bits 510, 511, 959, and 1023 are not transmitted and are 0 filled. Bits 0-31 of a codeword (31>=bitnum[9:0]>=0) are locations in which parity bits are stuffed. Bits 0-2047 (2047>=bitloc[14:0]>=0) of the transmission stream are the locations within the subframe for parity.

Each bit in the transmission stream of the embodiment is in two code words: <G975num, bitloc[5:0], {1'b0, bitloc[14:6]}> and <G975num-bitloc[8:6]-1, bitloc[5:0] ^ bitloc [14:9], {1'b1, bitloc[8:6], bitloc[14:9]}> with 1'b0 indicating 1 bit of 0 and 1'b1 indicating 1 bit of 1. Bits 32640-32767 (32767>=bitloc[14:0]>=32640) of the transmission do not exist.

FIG. 10 is a diagram showing an example of mapping of selected bits in a subframe to codewords in accordance with the foregoing. In the example of FIG. 10 a 32640 bit subframe includes a bit "A" at bit location 31. The subframe also includes a bit "B" at bit location 95. When mapped to codewords, bit 31 "A" is at bit location 0 of codeword 31 terminating in subframe 7 and also at bit location 512 in codeword 31 terminating in subframe 6. Similarly, bit 95 "B" of subframe 7 is in bit 1 in codeword 31 terminating in subframe 7 and bit 576 in codeword 31 terminating in subframe 5.

The invention therefore provides for use of continuously interleaved codewords. Although the invention has been described with respect to certain specific embodiments, it should be recognized the invention comprises the novel and unobvious claims supported by this disclosure, and their insubstantial variations.

What is claimed is:

1. Circuitry for error correction encoding, comprising:
encoder circuitry for receiving a first stream of information comprised of symbols for transmission and for iteratively forming a stream of codewords for transmission, each codeword for transmission having n codeword symbols and each codeword for transmission formed using k symbols such that each codeword includes n–k symbols of redundant information, and, at least after at least formation of $$\frac{n}{2} - 1$$

codewords for transmission, each of the codewords for transmission having $$\frac{n}{2}$$

of the codeword symbols being symbols of previously formed codewords for transmission, the stream of codewords including a number of codewords several orders of magnitude greather than k, wherein n and k are integer numbers, and at least some of the symbols of previously formed codewords are symbols of redundant information of the previously formed codewords; and decoder circuitry for iteratively decoding, using a syndrome generator, received codewords of a second stream of information comprised of received symbols, each received symbol of each received codeword being in at least two received codewords, with $$\frac{n}{2}$$

of the symbols of any particular received codeword of the received codewords being in predecessor received codewords to the particular received codeword in the second stream of information.

2. The circuitry of claim 1 wherein each symbol for transmission of each codeword for transmission, at least after formation of at least $$\frac{n}{2} - 1$$

codewords, is a symbol for transmission in at least two codewords for transmission.

3. The circuitry of claim 1 wherein each symbol for transmission of each codeword for transmission is a symbol in two codewords.

4. The circuitry of claim 1 wherein each codeword for transmission is formed using a BCH code.

5. The circuitry of claim 1, wherein each codeword has initial symbols and a final 510 symbols, the final 510 symbols including 478 symbols of information and 32 symbols of redundant information, each of the final 510 symbols also being symbols of subsequently formed codewords.

6. The circuitry of claim 5, wherein the final 510 symbols are not symbols of the previously formed codewords.

7. The circuitry of claim 6, wherein at least some of the codeword symbols are not transmitted.

8. The circuitry of claim 7, wherein the codewords are arraigned into subframes of 32640 symbols, of which 2048 are symbols of redundant information with transmission arranged such that the symbols of redundant information are transmitted subsequent to symbols of non-redundant information for the subframe.

9. A method, performed using circuitry including a syndrome generator, for decoding data received over a communication medium, comprising:

receiving, over a communications medium, a stream of information including a plurality of codewords, each codeword having n symbols, n being an integer number;

decoding, using the circuitry, including use of the syndrome generator, a first codeword of the plurality of codewords to obtain an information word of k symbols, k being an integer number; and successively decoding, using the circuitry, including use of the syndrome generator, $$\left(\frac{n}{2} - 1\right)$$

further codewords each having n symbols, each of the $$\left(\frac{n}{2} - 1\right)$$

further codewords including one different symbol of the first codeword, each of the $$\left(\frac{n}{2} - 1\right)$$

further codewords including $$\frac{n}{2}$$

symbols of previously decoded codewords, for at least some of the further codewords at least some of the $$\frac{n}{2}$$

symbols of previously decoded codewords being redundant information of the previously decoded codewords, and each one of the $$\left(\frac{n}{2} - 1\right)$$

further codewords, other than a first of the $$\left(\frac{n}{2} - 1\right)$$

further codewords, including one different symbol from each of the $$\left(\frac{n}{2} - 1\right)$$

further codewords preceding such each further codeword in an ordered list of the $$\left(\frac{n}{2} - 1\right)$$

further codewords.

10. The method of claim 9 wherein each symbol of each codeword is a symbol in at least two codewords.

11. The method of claim 9 wherein each codeword is a BCH codeword having n−k symbols of redundant information.

* * * * *